US 6,667,512 B1

(12) United States Patent
Huster et al.

(10) Patent No.: US 6,667,512 B1
(45) Date of Patent: Dec. 23, 2003

(54) ASYMMETRIC RETROGRADE HALO METAL-OXIDE-SEMICONDUCTOR FIELD-EFFECT TRANSISTOR (MOSFET)

(75) Inventors: Carl R. Huster, San Jose, CA (US); Concetta Riccobene, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/539,577

(22) Filed: Mar. 31, 2000

Related U.S. Application Data

(60) Provisional application No. 60/178,850, filed on Jan. 28, 2000.

(51) Int. Cl.$^7$ .................. H01L 29/76; H01L 21/336
(52) U.S. Cl. ............... 257/328; 438/299; 438/302; 438/306; 257/335; 257/345
(58) Field of Search .................. 257/288, 335–336, 257/344–345, 368, 376, 328, 404, 408; 438/299, 302, 306, 379, 525

(56) References Cited

U.S. PATENT DOCUMENTS

| | | | |
|---|---|---|---|
| 5,780,912 A | | 7/1998 | Burr et al. |
| 5,790,452 A | * | 8/1998 | Lien ............... 365/154 |
| 5,891,782 A | | 4/1999 | Hsu et al. |
| 5,917,219 A | | 6/1999 | Nandakumar et al. |
| 5,985,727 A | * | 11/1999 | Burr ............... 438/302 |
| 5,989,963 A | | 11/1999 | Lunning et al. |
| 6,166,410 A | * | 12/2000 | Lin et al. ......... 257/324 |

OTHER PUBLICATIONS

T. Buti et al., "A New Asymmetrical Halo Source GOLD Drain (HS–GOLD) Deep Sub–Half–Micrometer n–MOSFET Design for Reliability and Performance," IEEE Transactions on Electron Devices, vol. 38, No. 8, Aug. 1991, pp. 1757–1764.

A. Hiroki et al., "A High Performance 0.1um MOSFET with Asymmetric Channel Profile," International Electron Devices Meeting, Technical Digest, IEDM'95 (1995) 439–442.

Y. Taur et al., "CMOS Devices below 0.1 um: How High Will Peformance Go?," International Electron Devices Meeting, Technical Digest, IEDM'97 (1997) 215–218.

S. Odanaka et al., "Potential Design and Transport Property of 0.1–um MOSFET with Asymmetric Channel Profile," IEEE Transactions on Electron Devices, vol. 44, No. 44, Apr. 1997, pp. 595–600.

"Narrow Base Lateral PNP Bipolar Fabrication Using Angle Implant Technique," IBM Technical Disclosure Bulletin, Dec. 1991, vol. 34, #7B, pp. 130–131.*

* cited by examiner

*Primary Examiner*—Minh Loan Tran
*Assistant Examiner*—Thomas L Dickey

(57) ABSTRACT

An asymmetric retrograde HALO Metal-Oxide-Semiconductor Field-Effect Transistor (MOSFET) includes a semiconductor substrate. A gate is formed over the substrate, the gate defining a channel thereunder in the substrate having a source side and a drain side. A retrograde HALO doped area is formed in the source side of the channel using tilted ion implantation. A source and drain are formed in the substrate adjacent to the source and drain sides of the channel. The asymmetrical doping arrangement provides the specified level of off-state leakage current without decreasing saturation drive current and transconductance.

13 Claims, 5 Drawing Sheets

ASYMMETRIC RETROGRADE HALO METAL-OXIDE-SEMICONDUCTOR FIELD-EFFECT TRANSISTOR (MOSFET)

This application claims the benefit of US provisional application No. 60/178,850, filed Jan. 28, 2000.

BACKGROUND OF THE INVENTION

1. Field of the Invention

The present invention generally relates to the art of microelectronic integrated circuits, and more specifically to an asymmetric retrograde HALO Metal-Oxide-Semiconductor Field-Effect Transistor (MOSFET).

2. Description of the Related Art

Constant advances in the art of microelectronic device fabrication have resulted in the realization of sub-quarter micron MOSFETs. As devices are scaled down to such small sizes, numerous problems emerge which require solution. A class of such problems is known in the art as "short channel effects", one of which is punchthrough, which occurs when electric field lines from the drain extend toward the source and reduce the potential barrier height.

Numerous arrangements have been proposed to inhibit punchthrough and other short channel effects. A recent proposal is described in U.S. Pat. No. 5,917,219, entitled SEMICONDUCTOR DEVICES WITH POCKET IMPLANT AND COUNTER DOPING", issued Jun. 29, 1999 to M. Nandakumar et al. This patent teaches how to form punchthrough inhibiting "HALO" implants or pockets under a MOSFET's source and drain where they abut the device's channel region.

The HALO regions have the same conductivity type as the device's channel (with a higher dopant concentration), and a conductivity type opposite to that of the device's source and drain. The opposite conductivity of the HALO pockets inhibit extension of the electric field lines from the drain toward the source and thereby punchthrough.

As MOSFETs have been scaled below quarter-micron channel lengths, background and channel doping have been raised to high levels to control short channel effects. This has led to reduced mobility and difficulty in obtaining a desired low threshold voltage. The above referenced patent to Nandakumar further teaches a response to this problem which involves providing a non-uniform channel profile with the peak of the concentration as close to the surface as possible while still maintaining a low surface concentration. This arrangement is used by Nandakumar in addition to the source and drain HALO implants.

Another proposal is described in a paper entitled "A New Asymmetrical Halo Source GOLD Drain (HS-GOLD) Deep Sub-Half-Micrometer n-MOSFET Design for Reliability and Performance", by T. Buti et al, IEEE Transactions on Electron Devices, Vol. 38, No. 8, Pages 1757 to 1764. This paper teaches how to form an asymmetrical channel doping profile with a HALO implant only on the source side.

In MOSFET design, it is desirable to provide high drive current (saturation drain current $I_{dsat}$) and transconductance $g_m$, and low off-state leakage current $I_{doff}$. Generally, any attempt to increase the drive current will produce a corresponding increase in off-state leakage current. This problem has heretofore limited the drive current in very short channel MOSFETs.

SUMMARY OF THE INVENTION

The present invention overcomes the problem which has existed in the prior art and limited the drive current in short channel MOSFETs. In accordance with the present invention, an asymmetric retrograde HALO Metal-Oxide-Semiconductor Field-Effect Transistor (MOSFET) includes a semiconductor substrate. A gate is formed over the substrate, the gate defining a channel thereunder in the substrate having a source side and a drain side.

A retrograde HALO doped area is formed in the source side of the channel using tilted ion implantation. A source and drain are formed in the substrate adjacent to the source and drain sides of the channel. The asymmetrical doping arrangement provides the specified level of off-state leakage current without decreasing saturation drive current and transconductance.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1A:
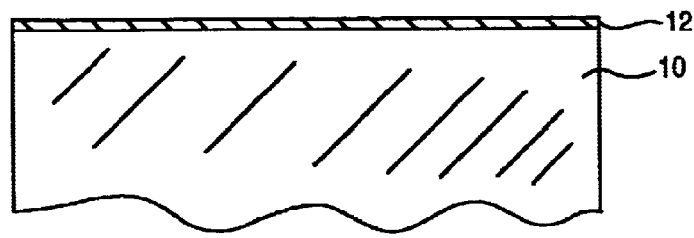
FIGS. 1a to 1f are simplified cross-sectional views illustrating a method of fabricating a MOSFET according to the present invention.

FIGS. 1a to 1f illustrate a method of fabricating an asymmetric retrograde HALO Metal-Oxide-Semiconductor Field-Effect Transistor (MOSFET) according to the present invention. In FIG. 1a a gate oxide layer 12 is formed on a semiconductor (e.g. silicon) substrate 10. The gate layer 12, as well as other device layers which will be described below; are formed using conventional MOSFET processing.

Figure 1B:
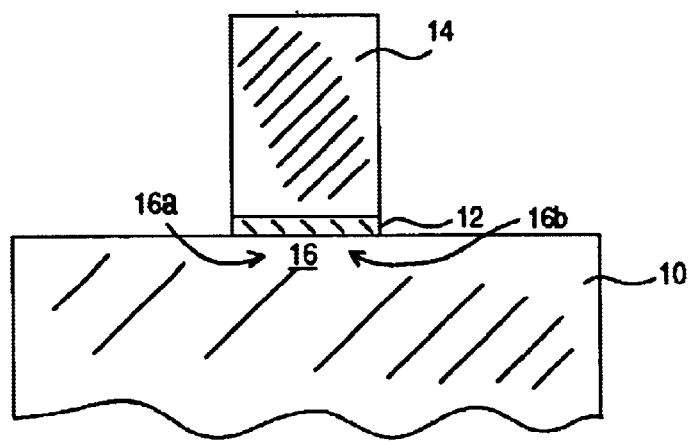

FIG. 1b illustrates the formation of a conductive gate layer 14 on the gate oxide layer 12. The gate layer 14 is formed of polysilicon, metal, or other conductive material in a conventional manner. The gate layers 12 and 14 are photolithographically patterned together and define a channel 16 thereunder having a source side 16a and a drain side 16b.

Figure 1C:
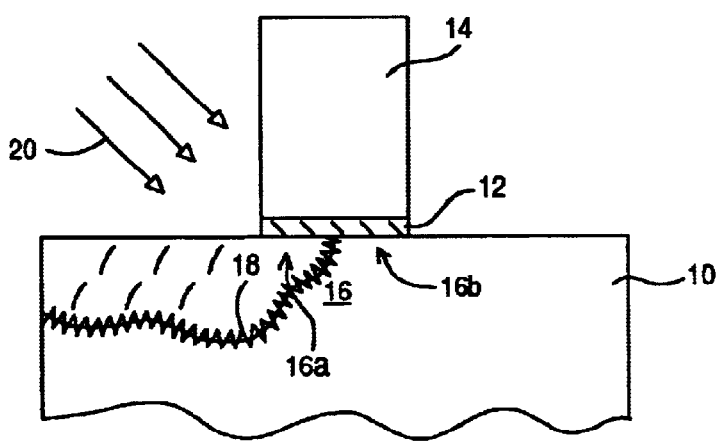

FIG. 1c illustrates an important fabrication step of the present invention. As shown, a tilt implant is performed to form a retrograde HALO doped area 18 in the source side 16a of the channel 16. The ion species is selected to be the same as that of the bulk channel 16, preferably boron for an NMOS device and phosphorous or arsenic for a PMOS device.

The implant of FIG. 1c is performed as indicated by arrows 20 at a tilt angle of approximately 30° to 60°, preferably approximately 45°. The dose and energy are selected such that the doped area 18 will have a retrograde channel profile with non-uniform concentration and a maximum value of concentration which is deeper below the surface of the substrate than with a conventional HALO implant.

The concentration of the implant in the area 18 will decrease from the source side 16a toward the drain side 16b of the channel 16, and typically will not reach the drain side 16b. It will be understood that the area 18 does not form a semiconductor junction in the channel 16.

The parameters of the implant of FIG. 1c will vary according to the particular device configuration. As a general guideline, the dose and energy may be approximately 1 to $5 \times 10^{13}$ cm$^2$ and 5 to 15 KeV for an NMOS device using boron as the implant species, and approximately 2 to $5 \times 10^{13}$ cm$^2$ and 25 to 35 KeV for a PMOS device using phosphorous or arsenic. However, the invention is not limited to these values, and the actual parameters used can differ substantially therefrom within the scope of the invention as long as they achieve the desired result.

Figure 1D:
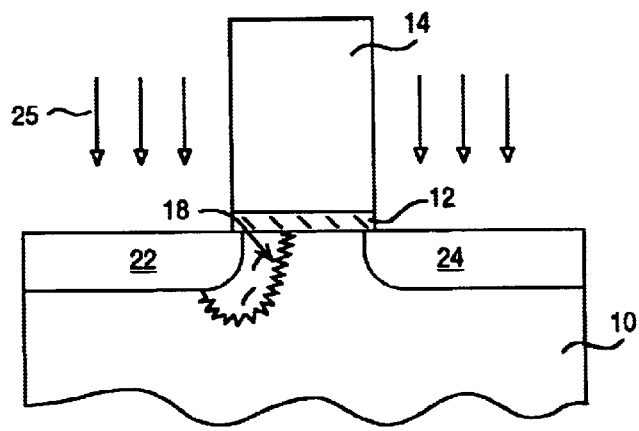

FIG. 1d illustrates the formation of a source extension implant 20 and a drain extension implant 22 as indicated by arrows 25 in accordance with conventional MOSFET processing.

Figure 1E:
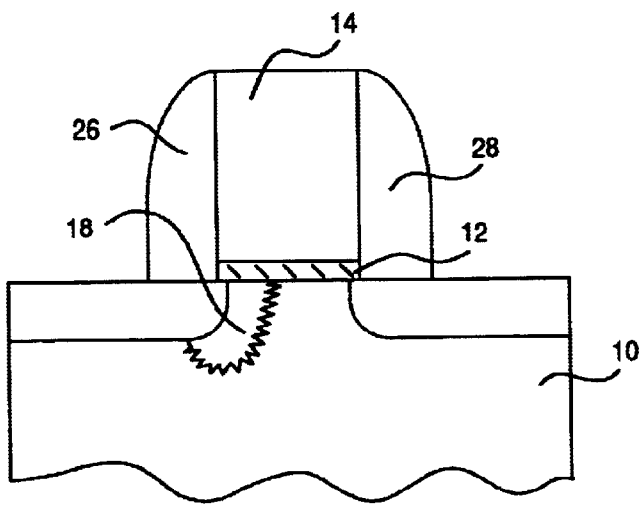
Figure 1F:
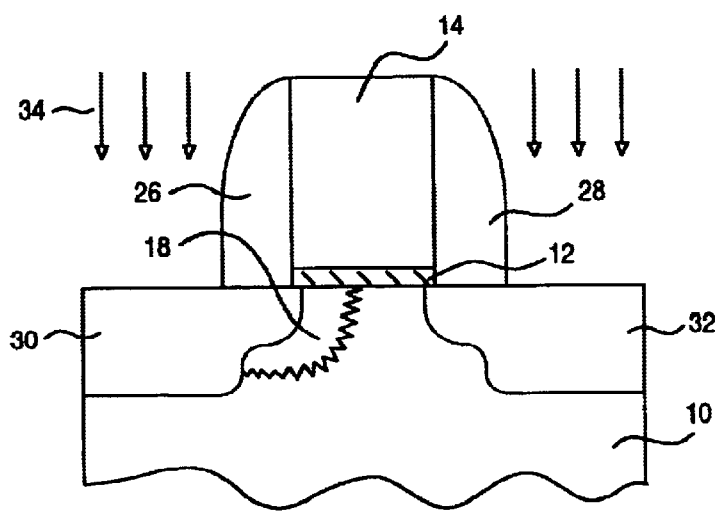

FIG. 1e illustrates the formation of sidewall spacers 26 and 28 on the substrate 10 on the source and drain sides of the gate 12,14. FIG. 1f illustrates implanting a source 30 and drain 32 adjacent to the source and drain sides 16a and 16b of the channel 16 respectively as indicated by arrows 34. The gate 12,14 will act as a self-alignment mask during this operation to prevent implanting further ions into the channel 16.

The ion species of the source 30 and drain 32 is opposite to that the bulk channel 16 and the implant area 18. Typically, phosphorous or arsenic will be used for an NMOS device, and boron will be used for a PMOS device.

Figure 2:
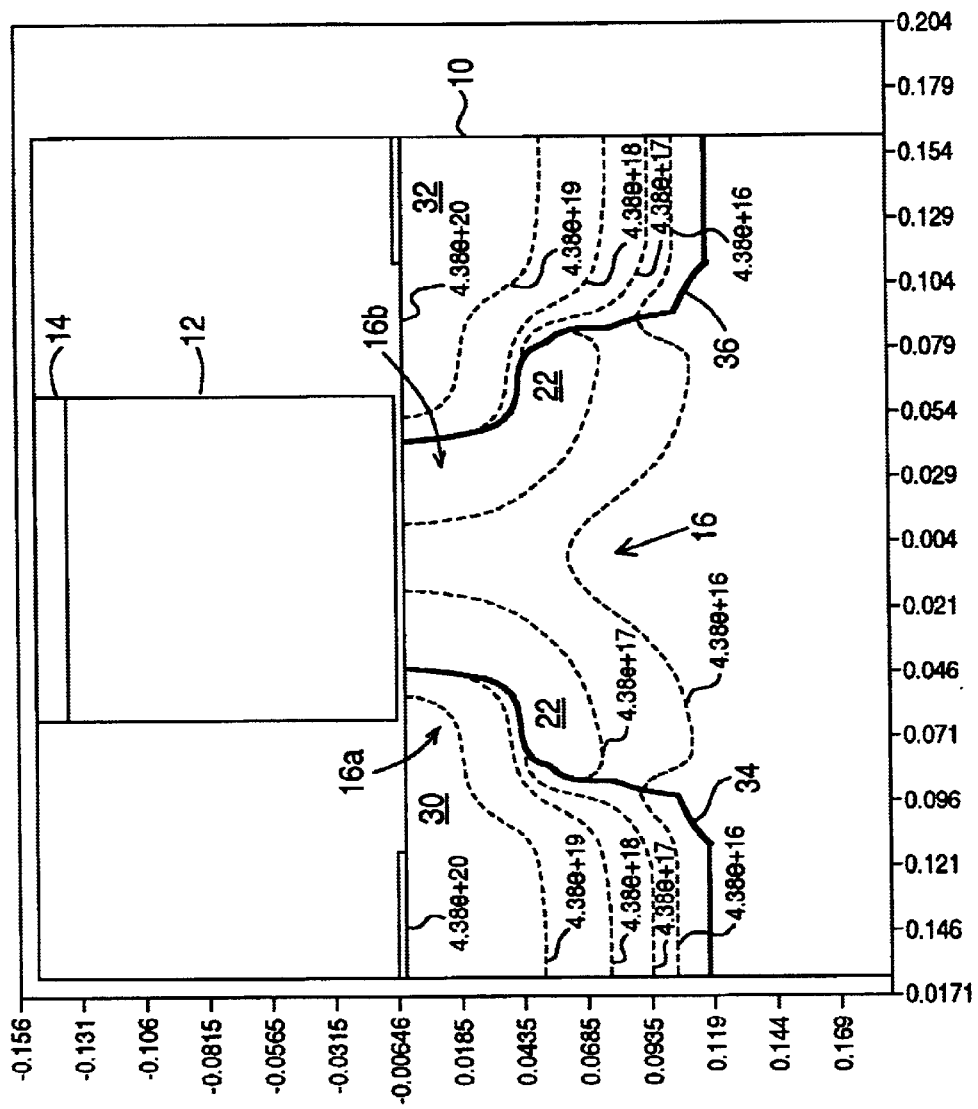
FIG. 2 is a diagram illustrating the doping profile of a symmetric HALO MOSFET.
Figure 3:
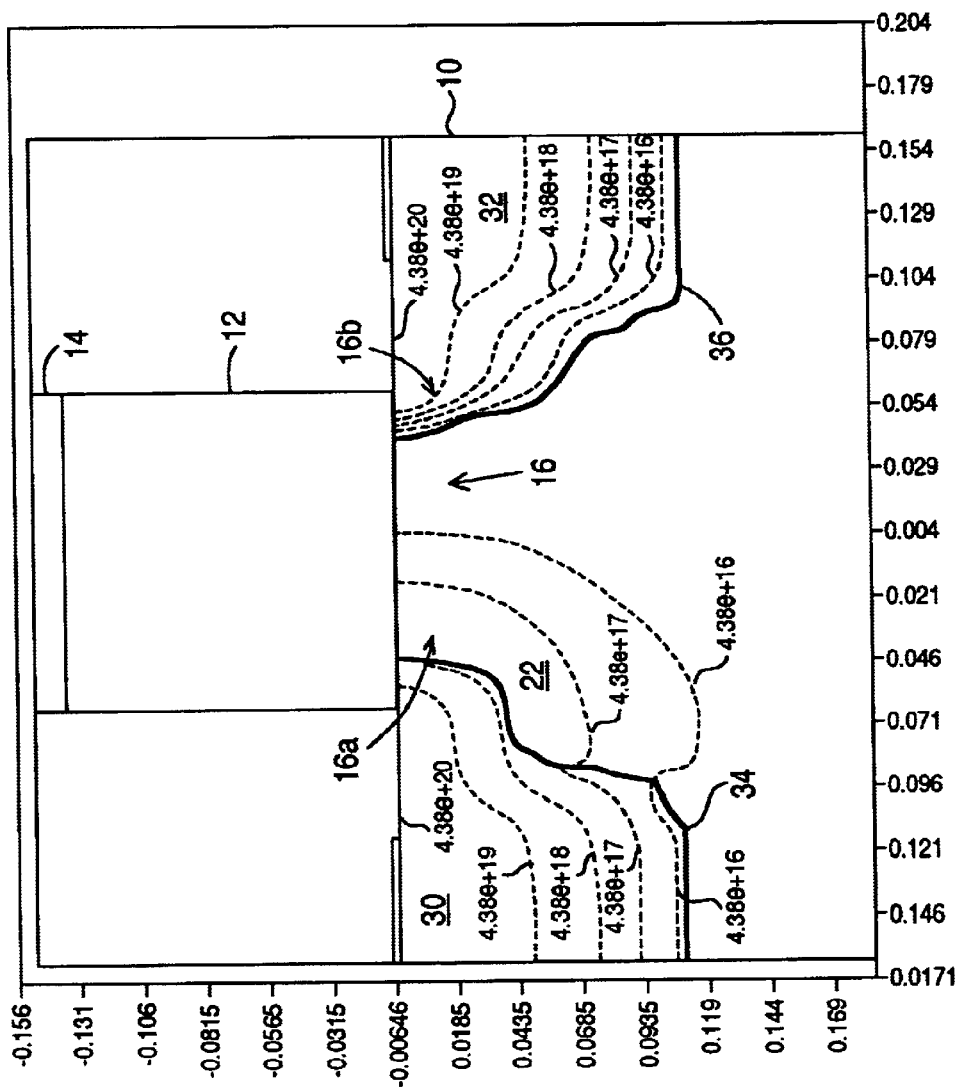
FIG. 3 is similar to FIG. 2 but illustrates an asymmetric HALO MOSFET.
Figure 4:
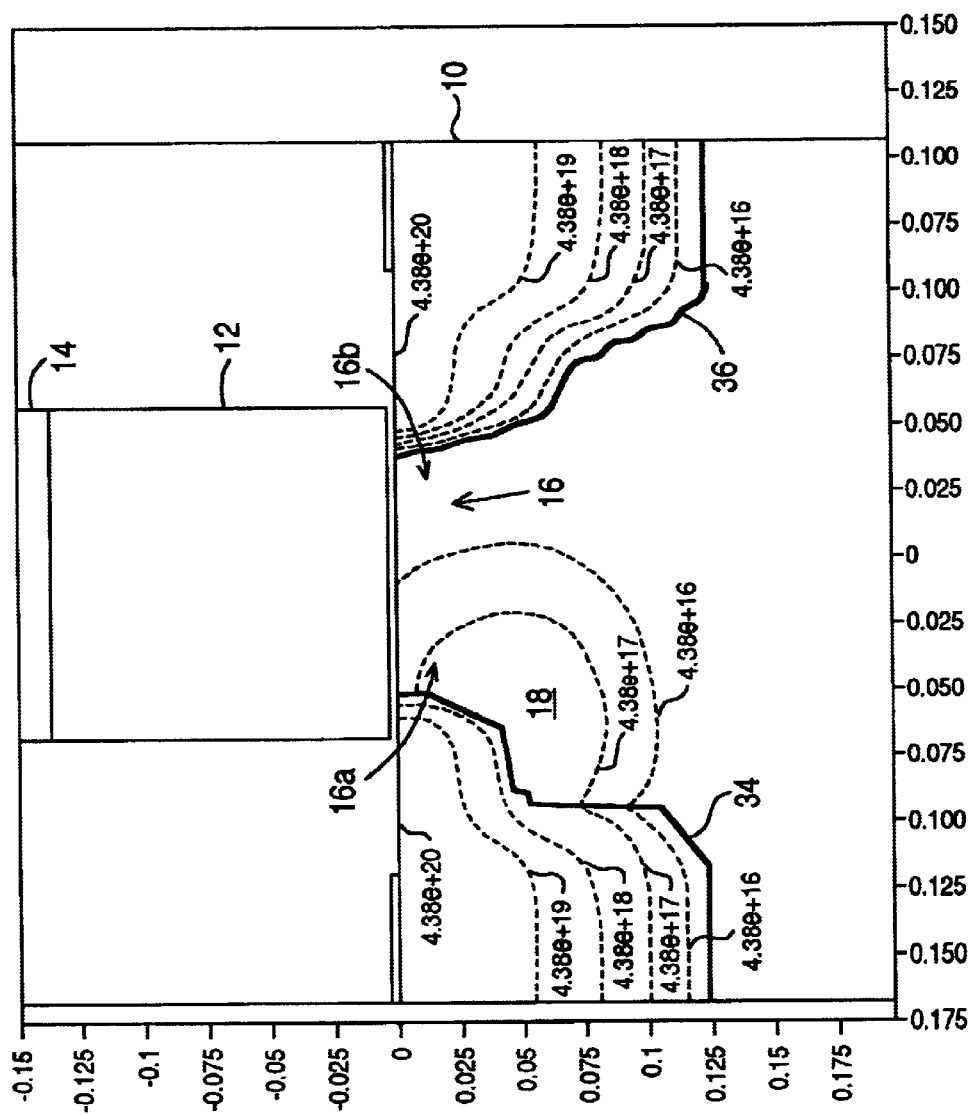
FIG. 4 is also similar to FIG. 2 but illustrates an asymmetric retrograde HALO MOSFET according to the present invention.

FIGS. 2, 3 and 4 illustrate computer simulations of exemplary doping profiles for three NMOS MOSFETs. FIG. 2 illustrates a symmetrical HALO device. FIG. 3 similarly illustrates an asymmetrical HALO device. FIG. 4 illustrates an exemplary asymmetric retrograde HALO MOSFET which is fabricated in accordance with the present invention as illustrated in FIG. 1f. The source/channel junction is designated as 34, and the drain/channel junction is designated as 36.

The MOSFETs of FIGS. 2, 3 and 4 are NMOS devices with a channel length of approximately 0.13 micron, although the invention is, of course, equally applicable to PMOS devices and MOSFETs with different channel lengths. In FIG. 4, the ion species for the HALO implant 18 was boron, and the peak concentration was $2.5 \times 10^{18}$cm$^{-3}$ located approximately 200 Å below the surface.

The off-state leakage current $I_{doff}$ for the devices of FIGS. 2, 3 and 4 was $2 \times 10^{-8}$ A/$\mu$m. However, the saturation drive current $I_{sat}$ for the three devices was $7.9003 \times 10^{-4}$ A/$\mu$m, $8.3059 \times 10^{31\ 4}$ A/$\mu$m and $8.62 \times 10^{-4}$ respectively.

The drive current and transconductance for the asymmetric retrograde HALO MOSFET of FIG. 4 are higher than the corresponding values for the devices of FIGS. 2 and 3. This was accomplished with the same value of off-state leakage current. As such, it will be seen that the present invention achieves its goal of increasing drive current and transconductance without increasing leakage off-state leakage current.

Various modifications will become possible for those skilled in the art after receiving the teachings of the present disclosure without departing from the scope thereof.

What is claimed is:

1. A method of fabricating an asymmetrical retrograde HALO Metal-Oxide-Semiconductor Field-Effect Transistor (MOSFET), comprising the steps of:
    (a) providing a semiconductor substrate;
    (b) forming a gate over the substrate, the gate defining a channel thereunder in the substrate having a source side and a drain side;
    (c) forming a retrograde HALO doped area in the source side of the channel using tilted ion implantation with a tilt angle of approximately 30° to 60° wherein the retrograde HALO doped area is in contact with the surface of the channel;
    (d) forming a source in the substrate adjacent to the source side of the channel; and
    (e) forming a drain in the substrate adjacent to the drain side of the channel, wherein a dopant concentration of the retrograde HALO doped area decreases from the source side of the channel toward the drain side of the channel.

2. A method as in claim 1, in which step (d) comprises forming the retrograde HALO doped area using tilted ion implantation with a tilt angle of approximately 45°.

3. A method as in claim 1, in which step (b) comprises the substeps of:
    (b1) forming a dielectric layer over the substrate; and
    (b2) forming a conductor layer over the dielectric layer.

4. A method as in claim 1, in which step (c) comprises forming the retrograde HALO doped area with a conductivity type which is opposite to that of the source and drain formed in steps (d) and (e).

5. A method as in claim 1, further comprising the step, performed between steps (c) and (d), of:
    (e) forming sidewall spacers over the substrate on source and drain sides of the gate.

6. An asymmetrical retrograde HALO Metal-Oxide-Semiconductor Field-Effect Transistor (MOSFET), comprising:
    a semiconductor substrate;
    a gate formed over the substrate, the gate defining a channel thereunder in the substrate having a source side and a drain side;
    a retrograde HALO doped area formed in the source side of the channel using tilted ion implantation with a tilt angle of approximately 30° to 60° wherein the retrograde HALO doped area is in contact with the surface of the channel;
    a source formed in the substrate adjacent to the source side of the channel; and
    a drain formed in the substrate adjacent to the drain side of the channel, wherein a dopant concentration of the retrograde HALO doped area decreases from the source side of the channel toward the drain side of the channel.

7. A MOSFET as in claim 6, in which the retrograde HALO doped area is formed using tilted ion implantation with a tilt angle of approximately 45°.

8. A MOSFET as in claim 6, in which the retrograde HALO doped area has a conductivity type which is opposite to that of the source and drain.

9. A MOSFET as in claim 6, further comprising sidewall spacers formed over the substrate on source and drain sides of the gate.

10. A method of fabricating an asymmetrical retrograde HALO Metal-Oxide-Semiconductor Field-Effect Transistor (MOSFET), comprising the steps of:
    (a) providing a semiconductor substrate;
    (b) forming a gate over the substrate, the gate defining a channel thereunder in the substrate having a source side and a drain side;
    (c) forming a retrograde HALO doped area in the source side of the channel using tilted ion implantation with a tilt angle of approximately 30° to 60° wherein the retrograde HALO doped area is in contact with the surface of the channel;

(d) forming a source in the substrate adjacent to the source side of the channel;

(e) forming a drain in the substrate adjacent to the drain side,of the channel;

(f) forming a source extension implant in the source side of the channel; and (g) forming a drain extension implant in the drain side of the channel.

11. The method as in claim 10, in which step (c) comprises forming the retrograde HALO doped area with a conductivity type which is opposite to that of the source and the drain formed in steps (d) and (e).

12. An asymmetrical retrograde HALO Metal-Oxide-Semiconductor Field-Effect Transistor (MOSFET), comprising:

a semiconductor substrate;

a gate formed over the substrate, the gate defining a channel thereunder in the substrate having a source side and a drain side;

a retrograde HALO doped area formed in the source side of the channel using tilted ion implantation with a tilt angle of approximately 30° to 60° wherein the retrograde HALO doped area is in contact with the surface of the channel;

a source formed in the substrate adjacent to the source side of the channel;

a drain formed in the substrate adjacent to the drain side of the channel;

a source extension implant formed in the source side of the channel; and a drain extension implant formed in the drain side of the channel.

13. The method as in claim 12, in which the retrograde HALO doped area has a conductivity type which is opposite to that of the source and the drain.

* * * * *